(12) United States Patent
Nguyen et al.

(10) Patent No.: US 7,777,658 B2
(45) Date of Patent: Aug. 17, 2010

(54) SYSTEM AND METHOD FOR AREA-EFFICIENT THREE-LEVEL DYNAMIC ELEMENT MATCHING

(75) Inventors: Khiem Quang Nguyen, Tewksbury, MA (US); Abhishek Bandyopadhyay, Woburn, MA (US); Michael Determan, Brighton, MA (US)

(73) Assignee: Analog Devices, Inc., Norwood, MA (US)

( * ) Notice: Subject to any disclaimer, the term of this patent is extended or adjusted under 35 U.S.C. 154(b) by 10 days.

(21) Appl. No.: 12/334,097

(22) Filed: Dec. 12, 2008

(65) Prior Publication Data

US 2010/0149012 A1    Jun. 17, 2010

(51) Int. Cl.
*H03M 3/00*    (2006.01)
(52) U.S. Cl. ...................................... 341/143; 341/144
(58) Field of Classification Search ........... 341/143–144
See application file for complete search history.

(56) References Cited

U.S. PATENT DOCUMENTS

| | | | | |
|---|---|---|---|---|
| 5,404,142 | A * | 4/1995 | Adams et al. | 341/144 |
| 6,344,812 | B1 * | 2/2002 | Takeda et al. | 341/143 |
| 6,522,277 | B2 * | 2/2003 | Fujimori et al. | 341/144 |
| 6,697,003 | B1 | 2/2004 | Chen | |
| 7,053,808 | B2 * | 5/2006 | Chen | 341/144 |
| 7,079,063 | B1 * | 7/2006 | Nguyen et al. | 341/144 |
| 7,486,210 | B1 * | 2/2009 | Hong et al. | 341/60 |
| 2002/0105453 | A1 * | 8/2002 | Fujimori et al. | 341/144 |
| 2003/0001764 | A1 | 1/2003 | Ruha et al. | |
| 2003/0201922 | A1 | 10/2003 | Dagher et al. | |
| 2005/0116851 | A1 | 6/2005 | Clara et al. | |
| 2007/0040720 | A1 * | 2/2007 | Kim | 341/144 |

OTHER PUBLICATIONS

PCT International Search Report and Written Opinion for PCT/US2009/66706 mailed on Jan. 29, 2010.

* cited by examiner

*Primary Examiner*—Khai M Nguyen
(74) *Attorney, Agent, or Firm*—Kenyon & Kenyon LLP (57) ABSTRACT

A system for converting digital signals into analog signals using sigma-delta modulation and includes a signed thermometer encoder for converting a plurality of signed binary data received at the encoder into a plurality of signed thermometer data and a rotational dynamic element matching (DEM) arrangement for receiving the plurality of signed binary data and the plurality of signed thermometer data. The rotational DEM arrangement further includes a first barrel shifter for receiving a positive thermometer data at a cycle, the first barrel shifter having a first pointer indicating a starting position of next positive thermometer data, and a second barrel shifter for receiving a negative thermometer data at a cycle, the second shifter having a second pointer indicating a starting position of next negative thermometer data, wherein the first pointer is circularly shifted as a function of positive binary data and the second pointer is circularly shifted as a function of negative binary data.

23 Claims, 14 Drawing Sheets

FIG. 1

PRIOR ART

FIG. 2

PRIOR ART

FIG. 3

PRIOR ART

| B | B̄ | Z | |
|---|---|---|---|
| 0 | 0 | 1 | |
| 0 | 1 | 0 | |
| 1 | 0 | 0 | |
| 1 | 1 | ILLEGAL | This condition does not exist |

FIG. 4

*PRIOR ART*

FIG. 5

PRIOR ART

SYSTEM AND METHOD FOR AREA-EFFICIENT THREE-LEVEL DYNAMIC ELEMENT MATCHING

FIELD OF THE INVENTION

The present invention is generally directed to a sigma-delta converter. In particular, the present invention is directed to a sigma-delta converter that employs an area-efficient dynamic element matching (DEM) scheme to the output of a three-level signed thermometer encoder.

BACKGROUND INFORMATION

Figure 1:
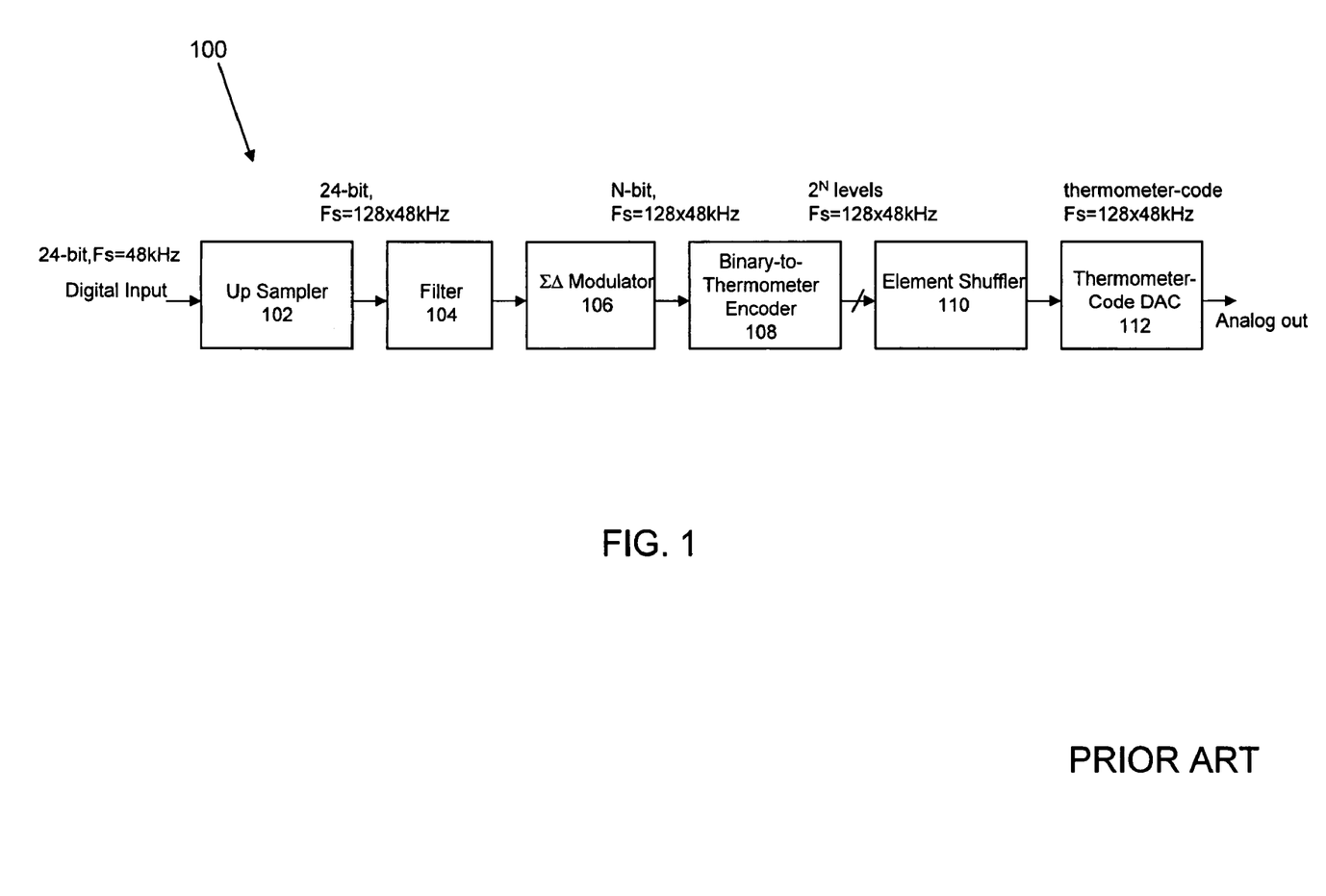
FIG. 1 shows a systematic diagram of a multi-bit sigma-delta DAC for converting digital input signals into analog output signals.

Sigma-delta digital-to-analog converters (DACs) are widely used for high resolution and low distortion digital to analog signal conversions. They are cost effective compared to traditional Nyquist converters. FIG. 1 shows a typical multi-bit noise-shaped oversampling DAC system 100. A digital input may be first up-sampled by an up-sampler 102 at an oversampling ratio (OSR), e.g., from a signal of 24-bit word width at 48 k Hz to the same word width at 128×48 k Hz. The up-sampled signal may then be filtered at 104 to suppress out-of-band images. A sigma-delta modulator 106 may follow the filter to reduce the word width, e.g., from 24 bit wide to N bit, where N<24. The sigma-delta modulator may also shape the in-band noise to a higher frequency region. Then a binary to thermometer encoder 108 may convert the binary data of, e.g., N bits, into thermometer-code data of, e.g., $2^N$ levels for converting binary codes into an analog signal.

However, a multi-bit (i.e., for N>2) DAC may cause unwanted linear errors in the analog signal output as discussed in U.S. Pat. No. 5,404,142 (the '142 patent). One technique to reduce the linear errors in the analog output may be to use a shuffler 110 (or scrambler) to shuffle the thermometer-code data. For example, the '142 patent discloses a data-directed scrambling technique in which a quantized noise-shaped word is first converted to a thermometer code. A data-directed shuffler is then used to dynamically select a group of elements at the output stage. The number of elements selected may equal to the number of active thermometer codes. Finally, a thermometer-code DAC 112 may convert the output of the shuffler into an analog quantity by activating the selected group of elements.

Figure 2:
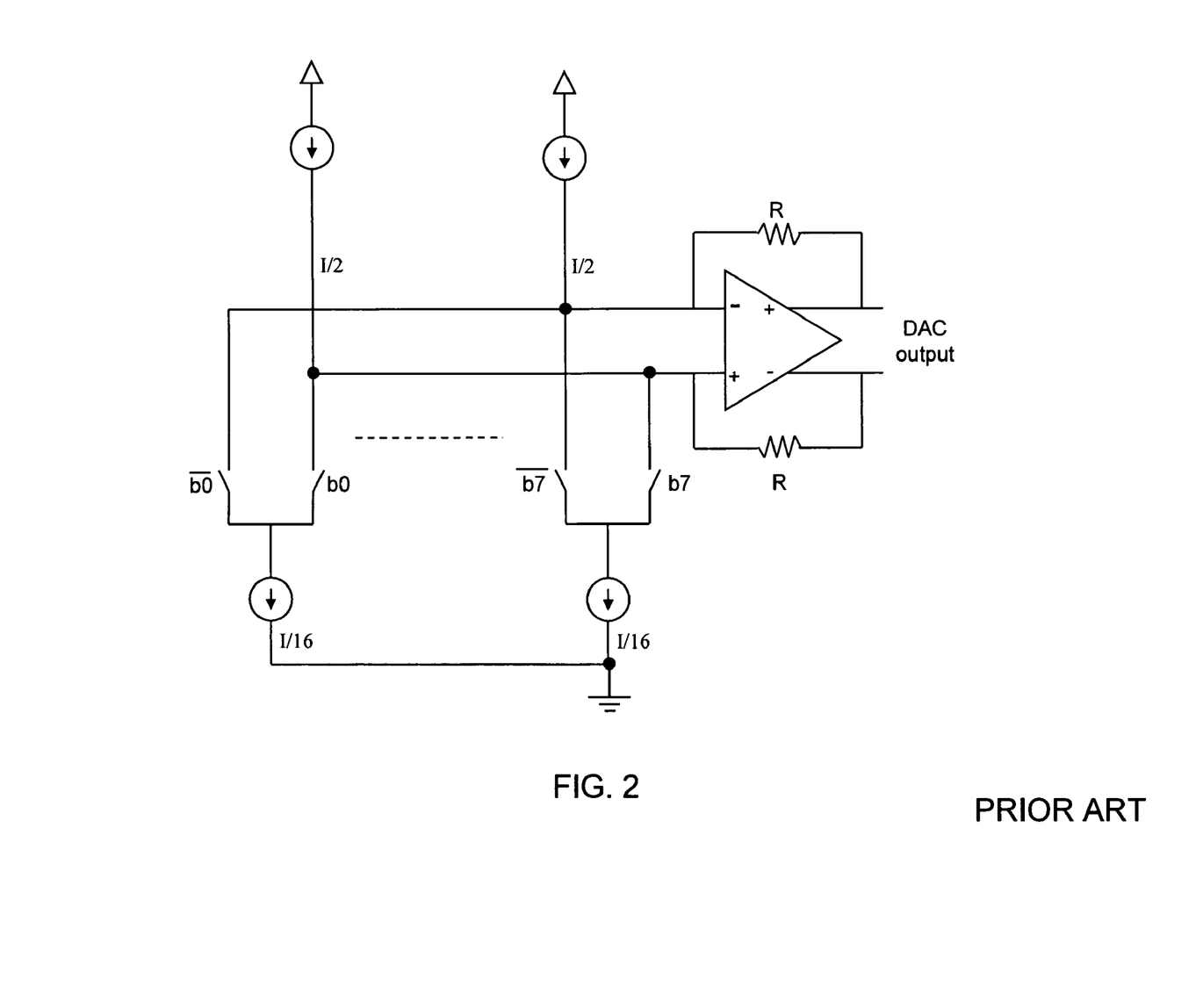
FIG. 2 shows a schematic diagram of a three-bit, two-level logic thermometer current steering DAC.

A thermometer-code DAC may include a current steering section and an I-to-V converter that includes a DAC cell driver, see e.g., FIG. 2, that controls the BIT and $\overline{\text{BIT}}$ (or BITB) signals. By designing the cross point of the BIT and BITB signals to be one $V_{gs}$ above the common-mode voltage, the inter-symbol interference (ISI) in the DAC cell output waveform may be minimized. $V_{gs}$ is defined to be the gate-to-source voltage of the DAC switches when each is conducting half of the output current.

Due to device imperfection in practice, current cells may not match exactly. This mismatch problem may result in harmonic distortion and noise in the reconstructed analog signal. The performance of the converter is thus limited by the mismatching of these elements. For this reason, commercially available silicon processes may only offer matching of up to 12 bits without calibration or trimming.

This element mismatch has been well studied, and methods have been proposed to shape the mismatch error into spectrally shaped noise. For example, shaping the mismatch error into out-of-band frequency region may greatly improve the signal-to-noise ratio (SNR) and dynamic range (DNR) of a converter. One type of solution may use a shuffler (or scrambler) to dynamically select a group of elements for each digital input code such that over time, each element is equally used. This implies that the first integral of the difference between every pair of elements is close to zero, hence, equivalent to a first-order noise shaped sigma-delta converters. The only difference is in a normal sigma-delta converter, the amplitude error is noise shaped whereas in a data shuffler, the error in the usage of the element is noise shaped. U.S. Pat. No. 6,614,377 shows an example butterfly style shuffler.

Referring to FIG. 2, one drawback of conventional thermometer-code current steering DACs is thermal noise performance. In particular, when data is zero, half of the switching current sources may be connected to one summing junction, and the other half may be connected to the other summing junction of the I-to-V converter. Moreover, the top current sources may be always connected to the summing junctions. The current sources are the dominant thermal noise source in the DAC output and dictate the SNR of the converter.

Figure 3:
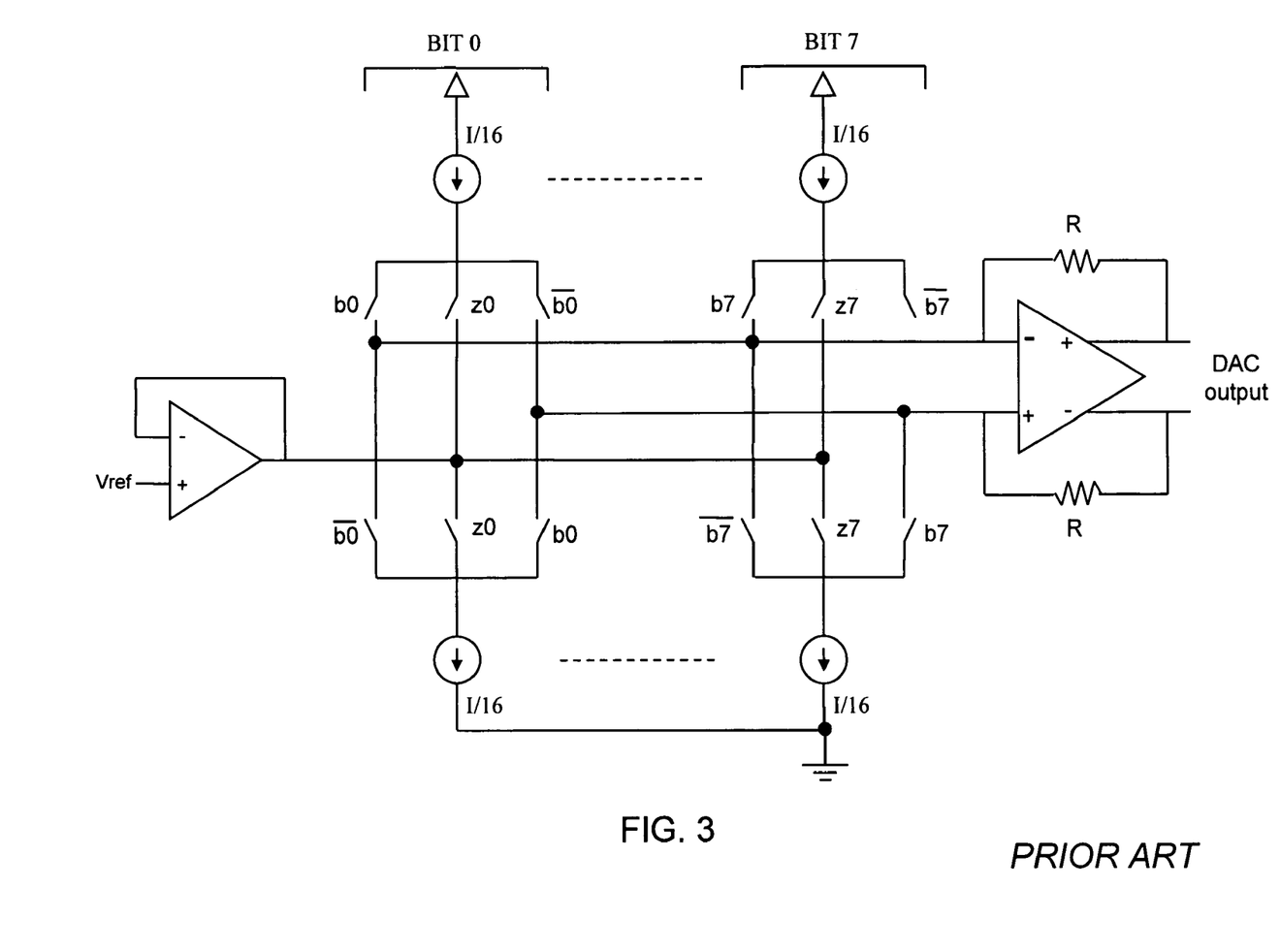
FIG. 3 shows a schematic diagram of a three-bit, three-level logic thermometer current steering DAC.
Figure 4:
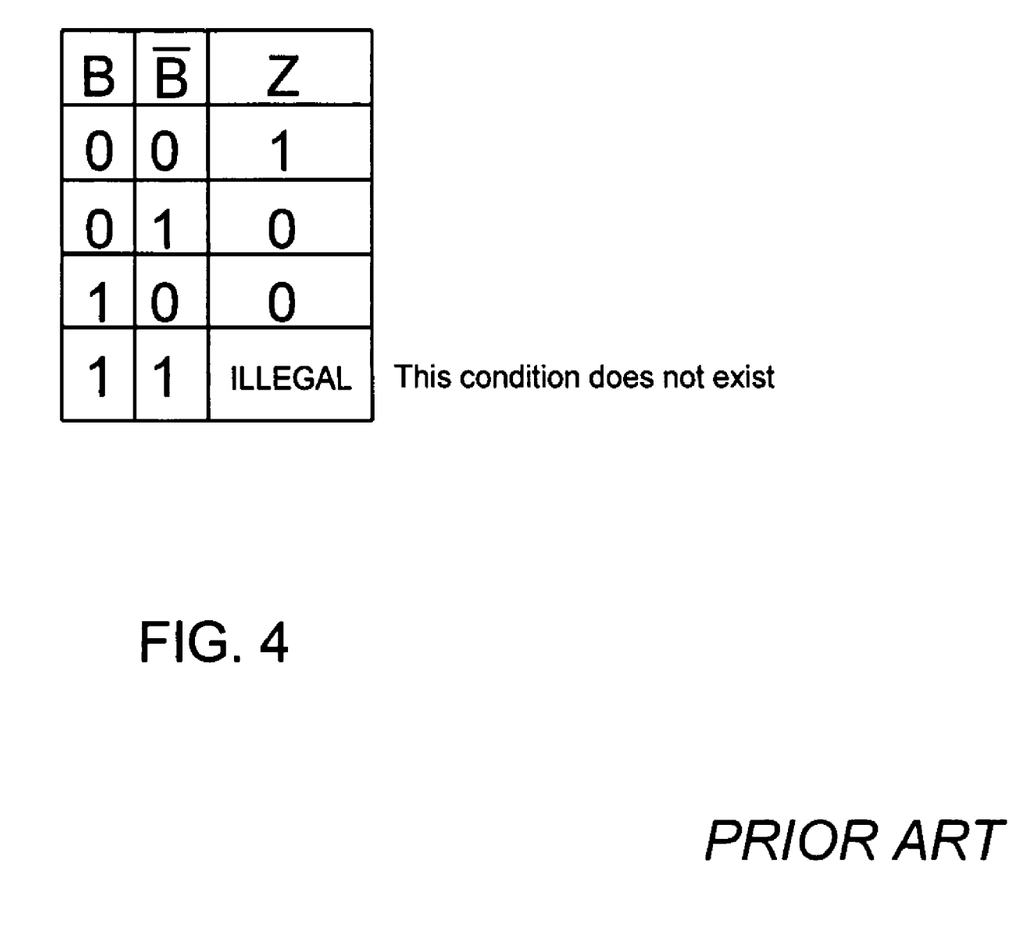
FIG. 4 shows a truth table of the output control signal z of the scheme shown in FIG. 3.

One technique to overcome the above-discussed thermal noise problem uses three-level logic thermometer current steering DAC that includes a pair of current sources (positive and negative) for, e.g., each of bits 0-7 (see e.g. FIG. 3). Since each pair of current sources may be connected to the summing junction in three different ways, each pair may contribute a positive quantity of charge, a negative quantity of charge, or nothing at all. When the data is zero, all the current sources are connected to a buffer amplifier to maintain their proper drain voltage. Thereby, the main noise source is from the amplifier, which by design is much smaller than that of the current sources. Hence, the SNR may be significantly improved. FIG. 4 shows a truth table for the control signal z as shown in FIG. 3.

Figure 5:
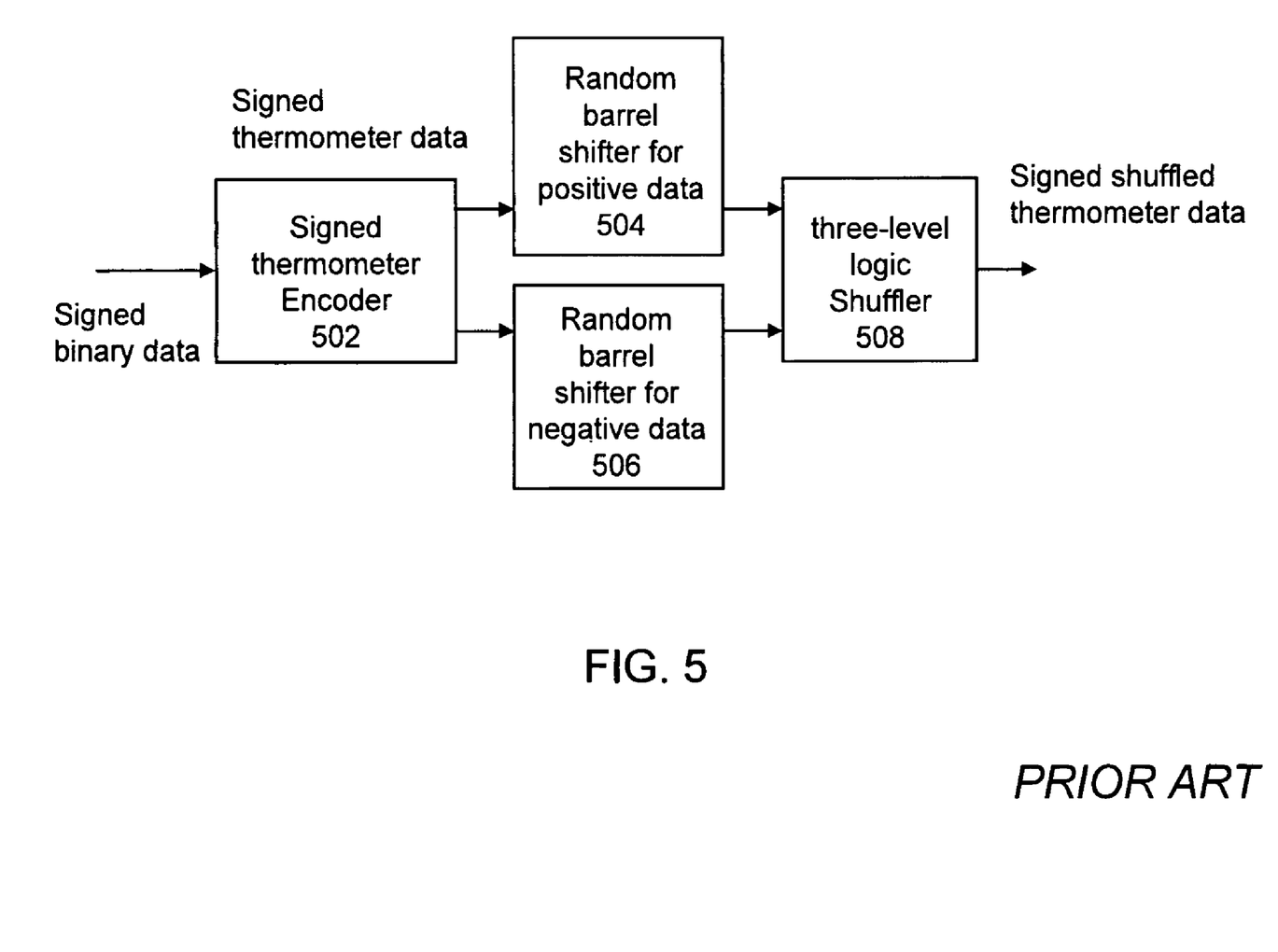
FIG. 5 shows a systematic diagram of a shuffler for shuffling thermometer data of a multi-bit, three-level sigma-delta DAC.

For the three-level logic thermometer current steering DAC, U.S. Pat. No. 7,079,063 (the '063 patent), proposed a dynamic element matching technique that works with three-level elements. Referring to FIG. 5, the proposed technique includes a signed thermometer encoder 502, two barrel shifters 504, 506, and a main data shuffler 508. The main data shuffler may function to shape mismatch errors into higher frequency region for preserving the base band SNR. Each output of the data shuffler may be a three-level signal which has a spectrum of the input base band and a first-order high-pass shaped noise. It follows that the difference between any pair of elements of the output may also be first-order high-passed. This implies that any mismatch error between the two elements may also be shaped.

The main shuffler 508 may include a network of shuffler cells inter-connected in a butterfly configuration (see e.g., FIGS. 6 and 7 of the '063 patent). Each shuffler cell may perform a first-order noise shaping function on the error introduced by the pair of elements controlled by the outputs of the cell. Since these first order modulators may produce idle tones that degrade the SNR and the total harmonic distortion (THD+N) performance of the converter, the '063 patent used two barrel shifters 504, 506 controlled by a pseudo-random number generator to break up any periodic behavior in the input streams of the main data shuffler to eliminate the idle tone problem.

SUMMARY OF INVENTION

The multiple-bit, three-level sigma-delta modulation techniques discussed above may have following drawbacks. First, the area of the data shufflers may take a relatively large portion of the whole area of the converter. Second, in low power applications, the data shuffler may represent a source of significant power consumption in a sigma-delta modulation circuit. For implementations with high channel counts, the effect of these drawbacks may become very prominent. Therefore, there is a need for area and power-efficient dynamic element matching technique and associated hardware implementation of sigma-delta modulations. One objective of the invention is to design an area and power efficient sigma-delta DAC without using shufflers similar to those shown in FIGS. 6 and 7 of the '063 patent.

One example embodiment of the present invention provides a sigma-delta DAC that may include a signed thermometer encoder for encoding signed binary data into signed thermometer data, and a rotational dynamic element matching (DEM) logic for outputting shuffled signed thermometer data. According to one example embodiment of the present invention, the rotational DEM logic may further include a DEM decision logic that may convert signed binary data input into positive and/or negative pointer data, a barrel shifter for shifting positive thermometer data input based on the positive pointer data, and a barrel shifter for shifting negative thermometer data input based on the negative pointer data.

Another example embodiment of the present invention provides a sigma-delta DAC that may include a signed thermometer encoder for encoding signed binary data into signed-magnitude thermometer data. According to one example embodiment of the present invention, the rotational DEM logic may further include a DEM decision logic that may convert signed binary data input into positive and/or negative pointer data, a single barrel shifter for shifting the signed-magnitude thermometer data based on both the positive and negative pointer data, and a sign bit indicating the sign of the thermometer data.

DETAILED DESCRIPTION OF EXAMPLE EMBODIMENTS

Figure 6:
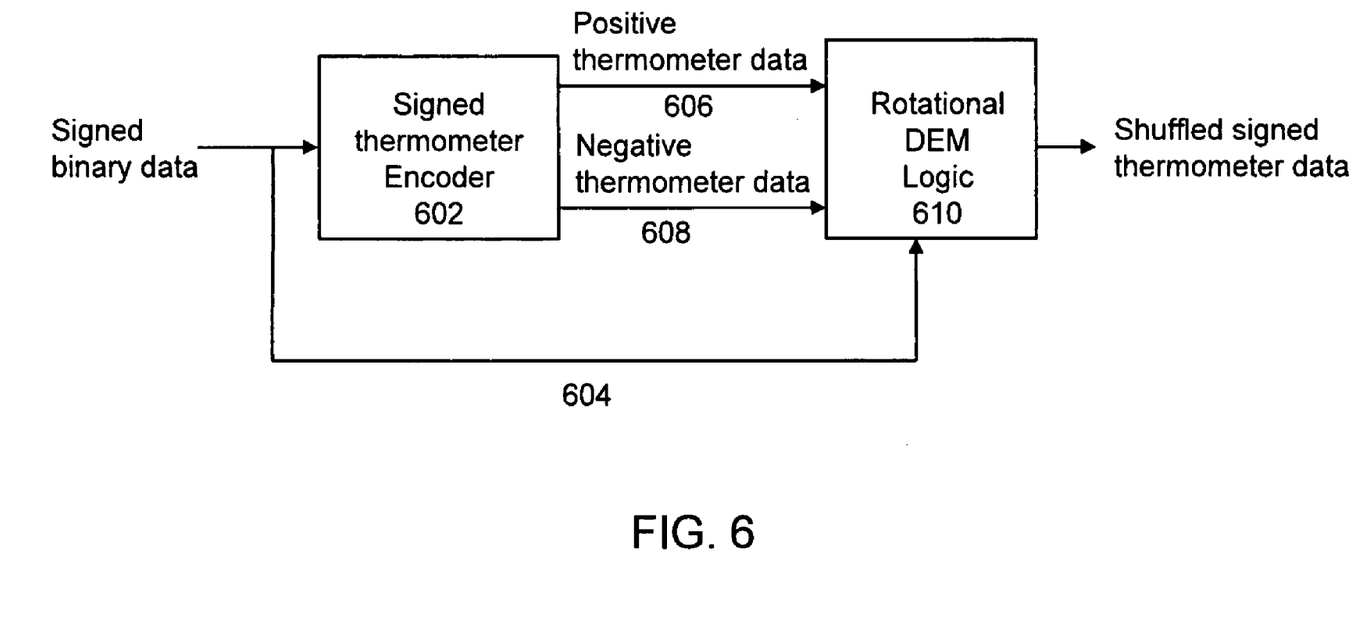
FIG. 6 shows a systematic diagram of a shuffler using a rotational DEM logic for shuffling signed thermometer data according to one example embodiment of the present invention.

FIG. 6 shows a systematic diagram of a shuffler using a rotational DEM logic for shuffling signed thermometer data according to one example embodiment of the present invention. In a multi-bit, three-level logic sigma-delta DAC, the digital input may include signed binary data. In one example embodiment of the present invention, the signed binary data input, e.g., N bit binary data, may be encoded at a signed thermometer encoder 602 into $2^N$ levels of thermometer data. The signed thermometer encoder 603 may encode positive binary data input into positive thermometer data and negative binary data input into negative thermometer data. The signed thermometer data and the signed binary data may be both fed to a rotational DEM functional unit (see details in the following FIG. 7) for producing an output of shuffled signed thermometer data.

According to one example embodiment of the present invention, the signed thermometer data streams may be first paired up so that each pair can take the value of (+1, 0, or −1). The pairs of data may then be passed though two barrel shifters controlled by a dynamic element matching (DEM) logic block 610 where one barrel represents positive data, and one barrel represents negative data. The input of the DEM block may include the signed binary data. The output of the DEM logic block may include two pointers, —one for positive data and one for negative data, —called positive pointer and negative pointer for convenience—, which indicate the current location of the sequence of elements to be used as output.

Figure 7:
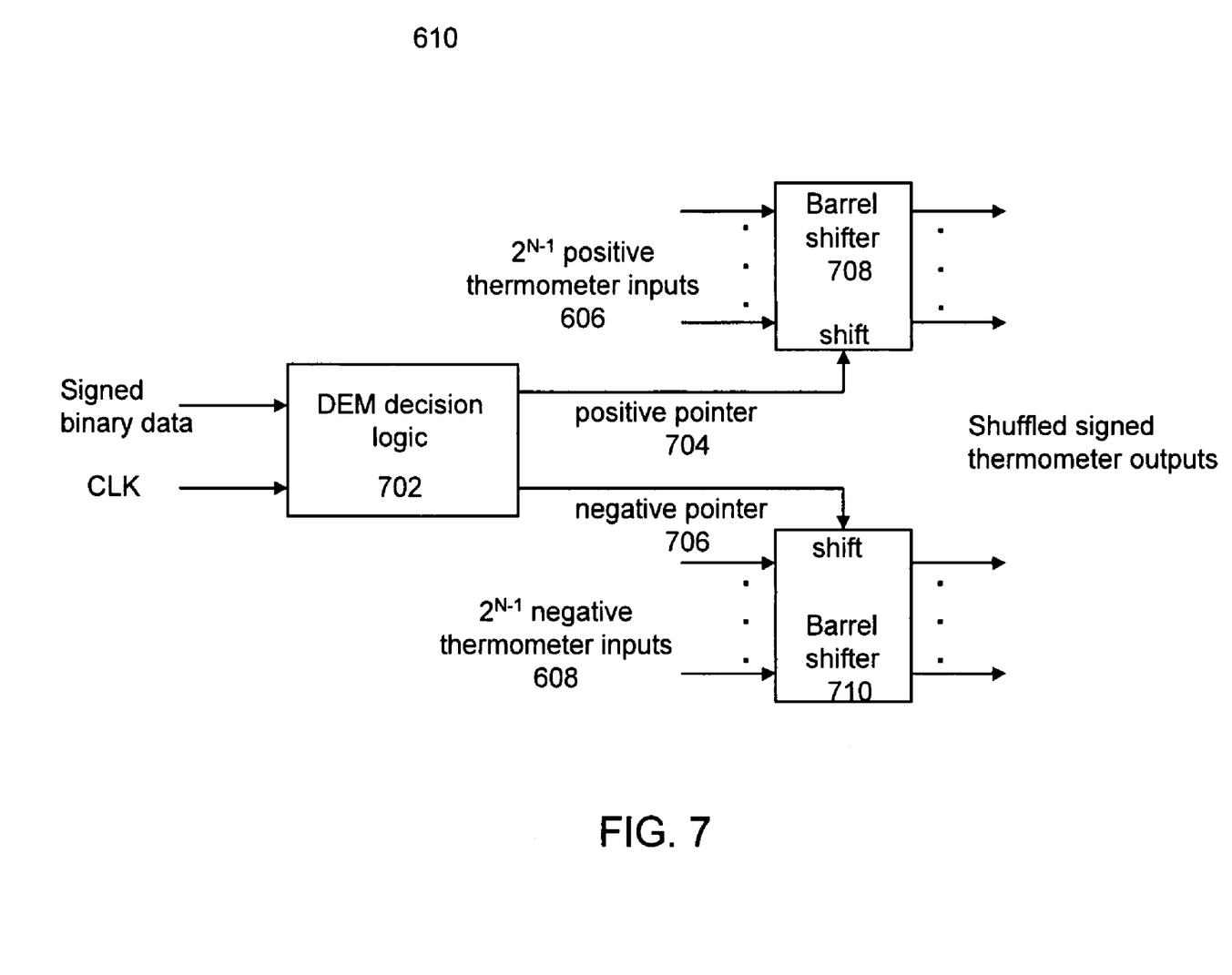
FIG. 7 shows a detailed systematic diagram of the rotational DEM logic for shuffling signed thermometer data using two barrels of shifters according to one example embodiment of the present invention.

FIG. 7 shows a detailed systematic diagram of the rotational DEM logic as shown in FIG. 6 for shuffling signed thermometer data using two barrels of shifter according to one example embodiment of the present invention. The rotational DEM logic 610 as shown in FIG. 6 may include a DEM decision logic 702 and two barrel shifters 708, 710. The DEM decision logic 702 may take input of signed binary data and generate a first pointer for positive data (called positive pointer 704 for convenience) and a second pointer for negative data (called negative pointer 706 for convenience). Although FIG. 7 illustrates barrel shifters 708, 710, other circular shift registers can find application in this design. Therefore, the barrel shifter 708 for positive thermometer input may be, e.g., a one byte register with a shift that controls a positive pointer pointing to a starting position of positive data, and the barrel shifter 706 for negative thermometer input may also be, e.g., a one byte register with a shift that controls a negative pointer pointing to a starting position of negative data.

When the signed binary data is positive, only the positive pointer may be updated based on the positive signed binary data. On the other hand, when the signed binary data is negative, only the negative pointer may be updated based on the negative signed binary data. The mismatch error of an element $u_i$ of a shuffler may be defined as the difference between the actual value of the element and the average value of all the elements. Specifically, for an N-element thermometer DAC, the error of element $u_i$ may be formulated as:

$$e_i = u_i - \frac{1}{N}\sum_{k=0}^{N-1} u_k$$

As such, each time when the data is "+1" and the element $u_i$ is selected, the error contributed to the output is $+e_i$. Each time when the data is "−1" and the element $u_i$ is selected, the error contributed to the output is $-e_i$. When the data is zero, the error contributed by element $u_i$ during that particular clock cycle is zero.

Figure 8:
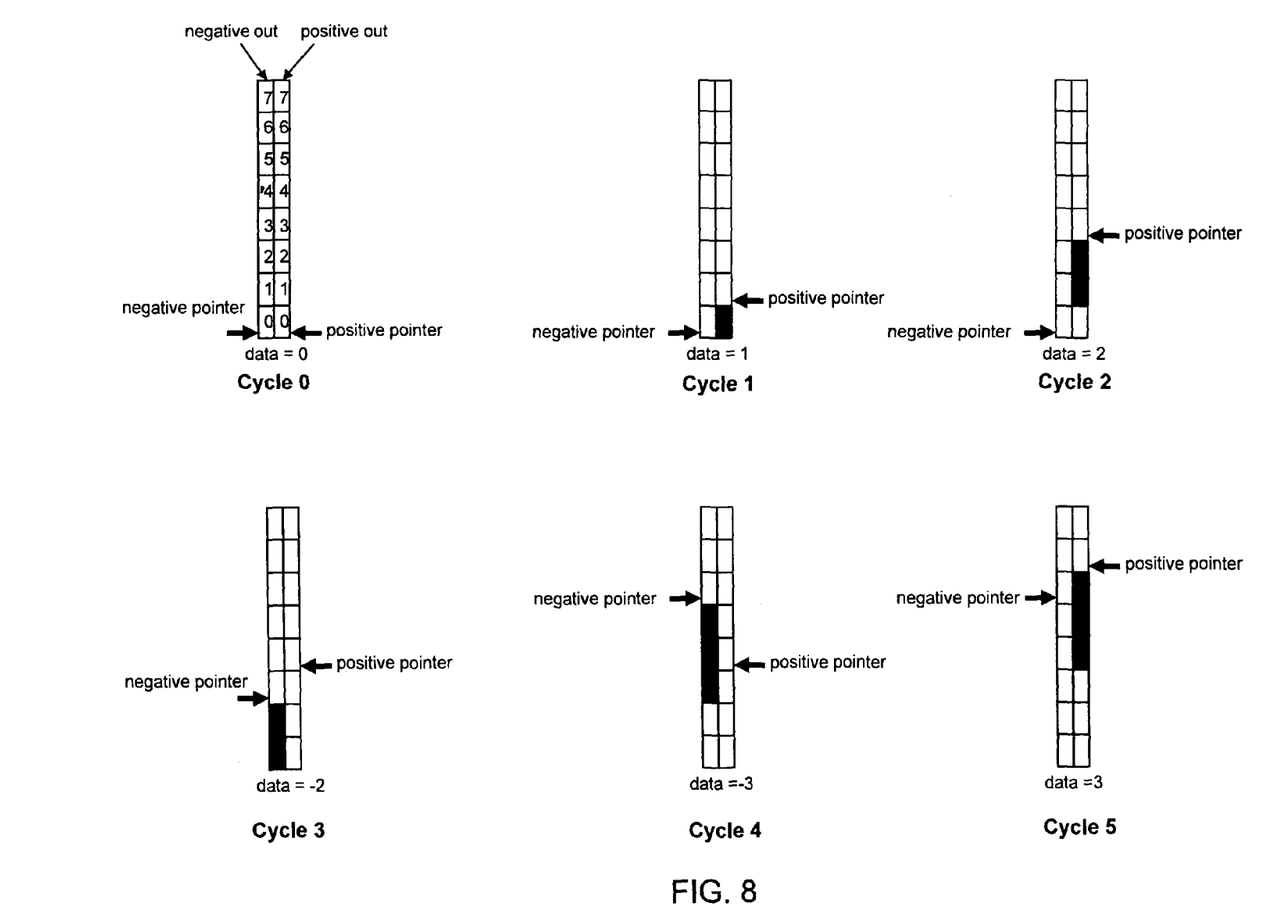
FIG. 8 illustrates exemplary operations of eight-element, three-level rotational DEM logic shufflers using two barrels of shifter according to one example embodiment of the present invention.

FIG. 8 illustrates exemplary operations of eight-element, three-level rotational DEM logic shufflers using two barrels of shifter according to one example embodiment of the present invention. In this example embodiment, a first shifter of 8 bit long may be used for positive thermometer magnitude data. A second shifter of 8 bit long may be used for negative thermometer magnitude data. The first and second shifters may be paired up with a positive pointer pointing to the position where to place next positive thermometer data and a negative pointer pointing to the position where to place next negative thermometer data. The initial positions of the positive and negative pointers may start, e.g., at position 0.

For an example input data sequence of (0, 1, 2, −2, −3, 3, −4, 3, 2, −4), each input data value represents a data value at a clock cycle. At cycle 0, both the positive and negative pointers are at position 0 for the input value is 0. At cycle 1, the positive pointer may move from position 0 to position 1 for the input value 1, while the positive element 0 is activated. At cycle 2, the positive pointer may move from position 1 to position 3 for the input value 2, while the positive elements 1 and 2 are activated. At cycle 3, the negative pointer may move from position 0 to position 2 for the input value 2, while the negative elements 0 and 1 are activated. At cycle 4, the negative pointer may move from position 2 to position 5 for the input value −3, while the negative elements 2 to 4 are activated. At cycle 5, the positive pointer may move from position 3 to position 6 for the input value 3, while the positive elements 3 to 5 are activated. At cycle 6, the negative pointer may move from position 5 to position 1 after a wrap around for the input value −4, while the negative elements 5 to 7 and 1 are activated.

At this point, it may be observed that since the positive and negative pointers advance and wrap around, all element within a barrel are used approximately equally for a long sequence of input values. Hence, the long term average error contributed by each element may approach zero. Assuming input symbols are randomly distributed in the sigma-delta modulated way, when both pointers are at an equal position, e.g., at position 1 at cycle 7, two observations may be made. First, all elements within a barrel of shifter would have been used equally among them. Second, the cumulative error contributed by each element would approach zero. This observation may impact the design of the three-level rotational scheme as discussed below.

One problem that may be associated with a rotational DEM is the low frequency correlation between the outputs. To alleviate this problem, in one embodiment of the present invention, each time the positive and negative pointers are at an equal position, e.g., at position 1 at cycle 7, a random number is generated, e.g., 4 at cycle 7. The positive and negative pointers may then be assigned to a position based on the random number, e.g., 4 at cycle 7. After the reseeding of the positive and negative pointers at cycle 8, the positive pointer may move from position 4 to position 6 for the input value 2, while the positive elements 4 and 5 are activated. Then at cycle 9, the negative pointer may move from position 4 to position 0 for the input value −4, while the negative elements 4 to 7 are activated.

In an alternative embodiment of the present invention each time the positive and negative pointers are at an equal position, e.g., at position 1 at cycle 7, both the positive and negative pointers may be moved by a constant number offset. By moving both the positive and negative pointers to a random position or offsetting both the positive and negative pointer positions by a constant when they are at an equal position, the low frequency pseudo-periodic behavior in the outputs may be substantially removed. Hence, the SNR of the sigma-delta DAC may be improved.

In another embodiment of the present invention, the requirement for hardware may be further reduced from two barrel shifters to one barrel shifter. It may be observed that the output of the data shuffler is signed thermometer code data for which the positive and the negative data portions may not be both active at the same time. Thereby the signed thermometer data output may be coded as a thermometer magnitude plus a sign bit for a further reduction of hardware. Correspondingly, the requirement for analog hardware may also be reduced. Outputting signed-magnitude thermometer encoder data (i.e., magnitude plus a sign bit) and maintaining this through the shuffler may also reduce the amount of digital nets, logic, and registers that may be required. Thus, power consumption and silicon area may be significant reduced.

Figure 9:
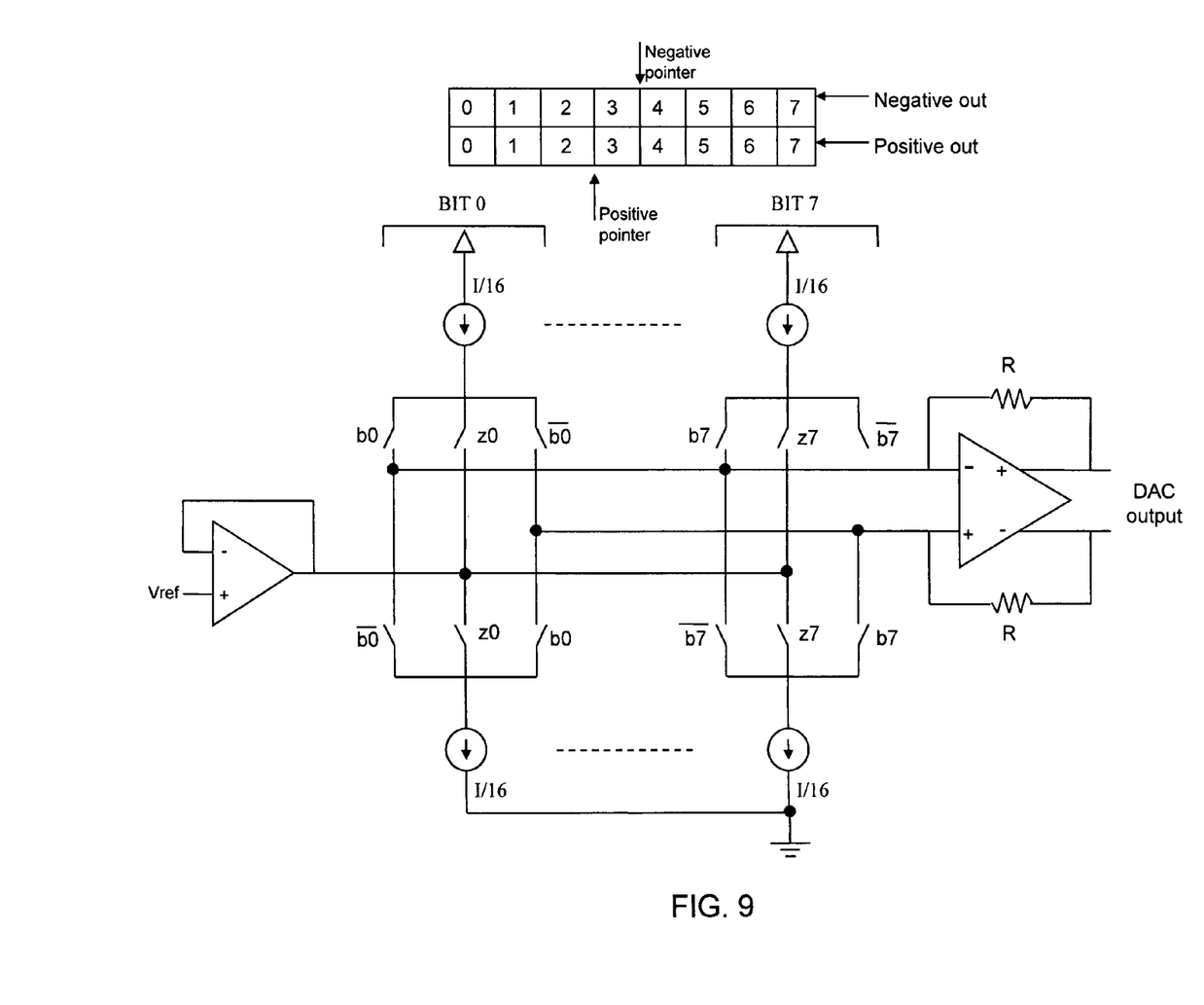
FIG. 9 shows an exemplary combination of the eight-element, three-level rotational DEM logic shufflers using two barrels of shifters as shown in FIG. 8 and the thermometer current steering DAC as shown in FIG. 3.

FIG. 9 shows an exemplary combination of the eight-element, three-level rotational DEM logic shufflers using two barrels of shifters as shown in FIG. 8 and the thermometer current steering DAC as shown in FIG. 3. The first shifter for positive output may drive bits: $b_0, b_1, \ldots, b_7$ and the second shifter for negative output may drive bits: $\overline{b_0}, \overline{b_1}, \ldots, \overline{b_7}$. The starting positions of the positive elements may be determined by the positive pointer and the starting of the negative elements may be determined by the negative pointer. The DAC outputs are signed magnitude data that may be randomized among elements 1, . . . , 7 due to the shifting positive and negative pointers.

Figure 10:
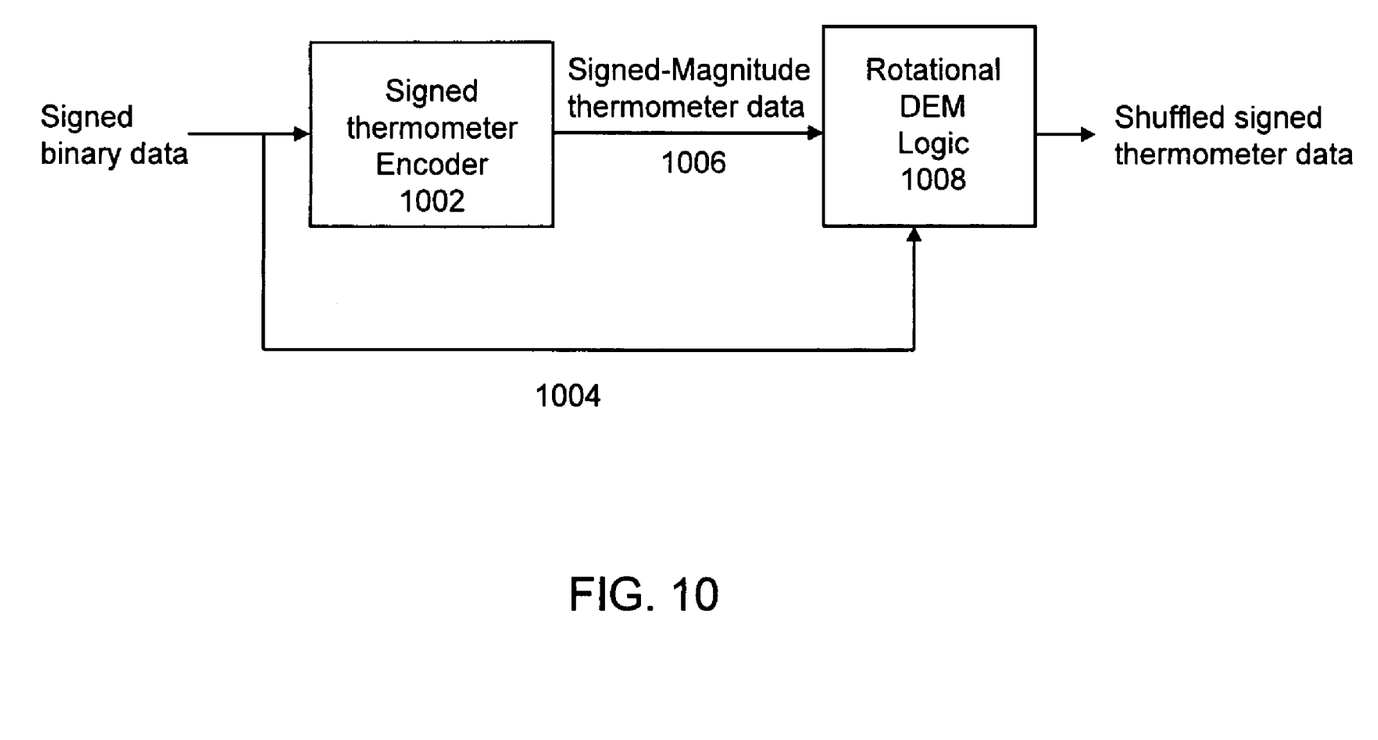
FIG. 10 shows a systematic diagram of a shuffler using a rotational DEM logic for shuffling signed-magnitude thermometer data according to one example embodiment of the present invention.

FIG. 10 shows a systematic diagram of a shuffler using a rotational DEM logic for shuffling signed-magnitude thermometer data according to one example embodiment of the present invention. Signed thermometer encoder 1002 may encode signed binary data input into signed-magnitude thermometer data 1006. Similar to FIG. 6, a rotational DEM logic 1008 may receive at inputs both signed-magnitude thermometer data 1006 and signed binary data 1004 to generate shuffled signed thermometer data.

Figure 11:
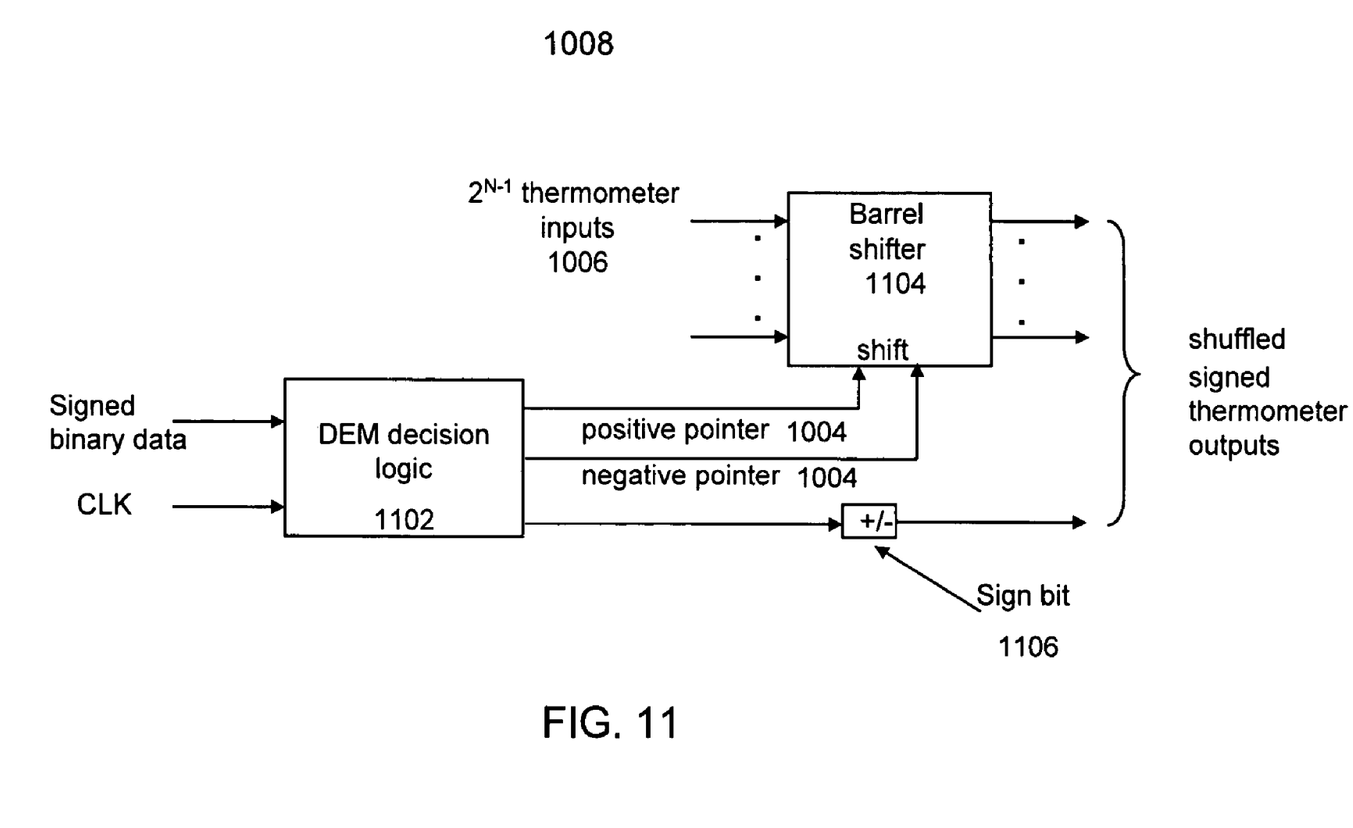
FIG. 11 shows a detailed systematic diagram of the rotational DEM logic for shuffling signed thermometer data using one barrel of shifters and one sign indicator according to one example embodiment of the present invention.

FIG. 11 shows a detailed systematic diagram of the rotational DEM logic 1008 as shown in FIG. 10 for shuffling signed thermometer data using one barrel of shifters and one sign bit according to one example embodiment of the present invention. The rotational DEM logic may include a DEM decision logic 1102 for converting signed binary data into positive and/or negative pointers, a barrel shifter 1104 for outputting the value of thermometer data, and a sign bit 1106 for indicating a sign of the thermometer data. In one example embodiment of the present invention, both the positive and negative pointers 1004 may point to a single barrel shifter 1104. The sign bit 1106 may be directly determined based on the sign of an output from the DEM decision logic 1102.

Figure 12:
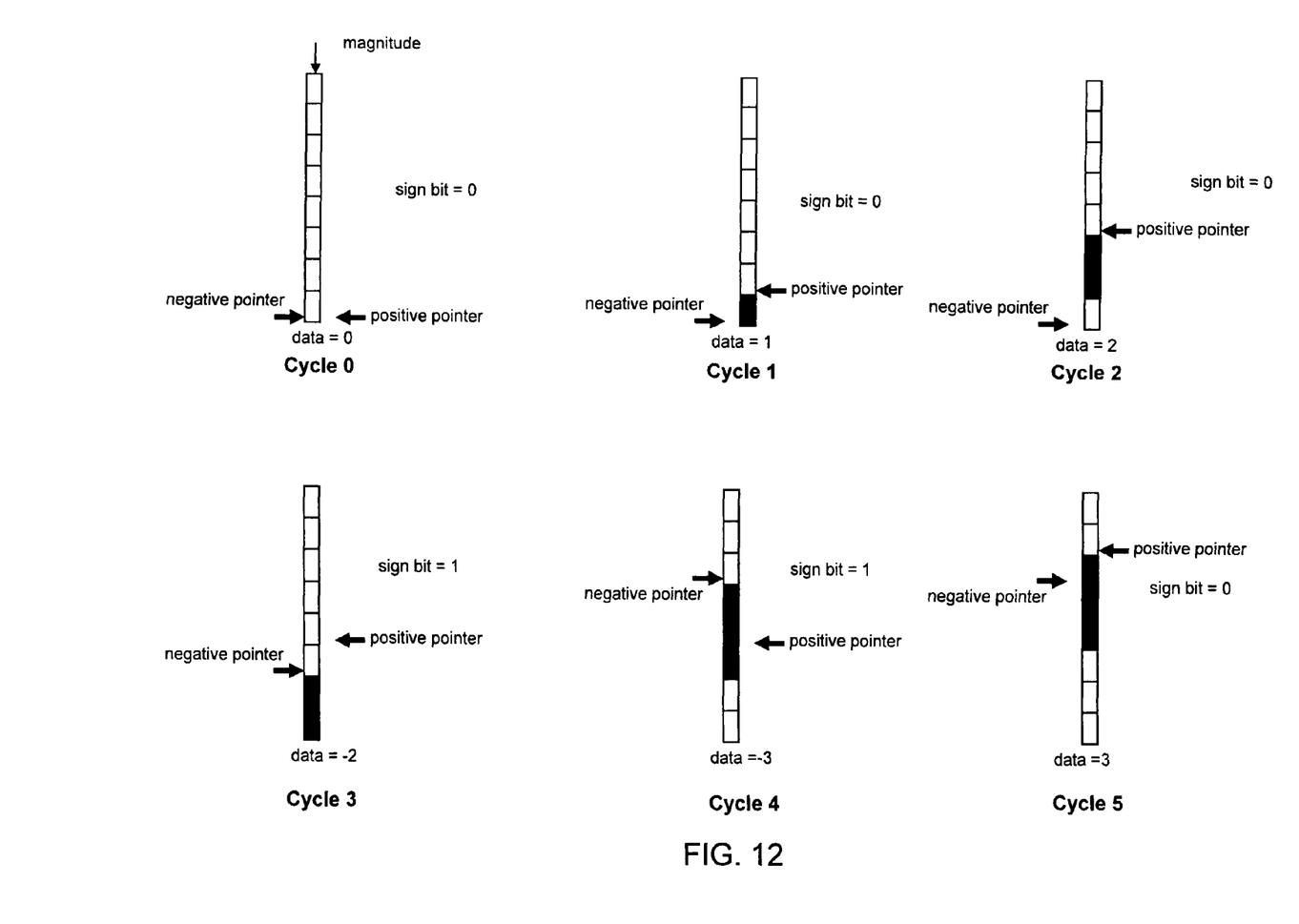
FIG. 12 illustrates exemplary operations of eight-element, three-level rotational DEM logic shufflers using one barrel of shifter and one sign indicator according to one example embodiment of the present invention.

FIG. 12 illustrates exemplary operations of eight-element, three-level rotational DEM logic shufflers using one barrel of shifter and one sign bit according to one example embodiment of the present invention. A number of elements of the single barrel shifter may represent the magnitude of the thermometer data, and a sign bit determined directly from the output of the DEM logic may indicate the sign of the magnitude, e.g., 0 for positive and 1 for negative. For the single barrel shifter, a positive pointer may point to a starting position of positive data and a negative pointer may point to a starting position of negative data. The positive and negative points may both start from position 0.

For an example input data sequence of (0, 1, 2, −2, −3, 3, −4, 3, 2, −4), the positive and negative pointers may move based on the input data value in a sequence similar to FIG. 8. Correspondingly, a sign bit may be updated based on signs of the input data. Therefore, for this example sequence, the sign bit=0 (i.e., indicating positive) at cycles 0, 1, 2, 5, 7, and 8, and the sign bit=1 (i.e., indicating negative) at cycles 3, 4, 6, and 9. Based on the thermometer magnitude and signs indicated at the sign bit, a signed thermometer data may be easily reconstructed.

Similar to FIG. 8, in one example embodiment of the present invention, when the positive and negative pointers are at an equal position, e.g., at position 1 at cycle 7, a random number may be generated, e.g., 4 at cycle 7. The positive and negative pointers may then be assigned to a position based on the random number, e.g., 4 at cycle 7. In an alternative embodiment of the present invention when the positive and negative pointers are at an equal position, e.g., at position 1 at cycle 7, both the positive and negative pointers may move by a constant number. By offsetting both the positive and negative pointer position by either a random number or constant when they are at an equal position, the low frequency pseudo-periodic behavior in the outputs may be substantially removed. Hence, the SNR of the sigma-delta DAC may be improved.

Similar to FIG. 9, in one example embodiment of the present invention, an eight-element, three-level rotational DEM logic shuffler using one barrel of shifters may be combined with a thermometer current steering DAC as shown in FIG. 3. A single shifter may drive both positive and negative outputs via bits: $b_0, b_1, \ldots, b_7$ and $\overline{b_0}, \overline{b_1}, \ldots, \overline{b_7}$. The starting positions of the positive elements may be determined by the positive pointer and the starting of the negative elements may be determined by the negative pointer. An extra sign bit may determine the sign of the output.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A system for converting digital signals into analog signals using sigma-delta modulation, comprising:
a signed thermometer encoder for converting a plurality of signed binary data received at the signed thermometer encoder into a plurality of signed thermometer data, wherein positive binary data are converted into positive thermometer data and negative binary data are converted into negative thermometer data; and
a rotational dynamic element matching (DEM) component for receiving the plurality of signed binary data and the plurality of signed thermometer data, the rotational DEM arrangement further comprising:
a first barrel shifter for receiving a positive thermometer data, the first barrel shifter having a first pointer indicating a starting position of a next positive thermometer data, and
a second barrel shifter for receiving a negative thermometer data, the second shifter having a second pointer indicating a starting position of a next negative thermometer data,
wherein the first pointer is circularly shifted as a function of only the positive binary data and the second pointer is circularly shifted as a function of only the negative binary data.

2. The system of claim 1, wherein each element of the first barrel shifter in relation to an initial first pointer position and each element of the second barrel shifter in relation to an initial second pointer position are paired up.

3. The system of claim 1, further comprising: a three-level thermometer code converter for converting a combined outputs from the first barrel shifter and the second barrel shifter into an analog signal.

4. The system of claim 3, wherein the three-level thermometer code converter is a digital-to-analog converter.

5. The system of claim 1, wherein upon receiving a positive thermometer data at a cycle, a number of elements starting from a position indicated by the first pointer of the first barrel shifter are activated and after the activation, the first pointer is circularly shifted by the number to point to next inactive element in the first barrel shifter.

6. The system of claim 5, wherein the number of elements indicates a magnitude of the positive thermometer data.

7. The system of claim 1, wherein upon receiving a negative thermometer data at a cycle, a number of elements starting from a position indicated by the second pointer of the second barrel shifter are activated and after the activation, the second pointer is circularly shifted by the number to point to next inactive element in the second barrel shifter.

8. The system of claim 7, wherein the number of elements indicates a magnitude of the negative thermometer data.

9. The system of claim 1, wherein when the first pointer and the second pointer are at a same element number, the first pointer and the second pointer are moved to an element whose number is generated using a random number generator.

10. The system of claim 1, wherein when the first pointer and the second pointer are at a same element number, both the first pointer and the second pointer are moved by a constant.

11. A system for converting digital signals into analog signals using sigma-delta modulation, comprising:
a signed thermometer encoder for converting a plurality of signed binary data received at the encoder into a plurality of signed thermometer data, wherein positive binary data are converted into positive thermometer data and negative binary data are converted into negative thermometer data; and
a rotational dynamic element matching (DEM) arrangement for receiving the plurality of signed binary data and the plurality of signed thermometer data, the rotational DEM arrangement further comprising:
a barrel shifter for receiving magnitude of a signed thermometer data, and
a sign indicator for indicating the sign of the signed thermometer data,
wherein the barrel shifter has a first pointer indicating a starting position of a next positive thermometer data and a second pointer indicating a starting position of a next negative thermometer data.

12. The system of claim 11, wherein the first pointer is circularly shifted as a function of only the positive binary data and the second pointer is circularly shifted as a function of only the negative binary data.

13. The system of claim 11, further comprising: a three-level thermometer code converter for converting an outputs from the barrel shifter and the sign indicator into analog signal.

14. The system of claim 13, wherein the three-level thermometer code converter is a digital-to-analog converter.

15. The system of claim 11, wherein upon receiving a positive thermometer data at a cycle, a number of elements starting from a position indicated by the first pointer of the barrel shifter are activated and after the activation, the first pointer is circularly shifted by the number to point to next inactive element in the barrel shifter.

16. The system of claim 15, wherein the number of elements indicates a magnitude of the positive thermometer data.

17. The system of claim 11, wherein upon receiving a negative thermometer data at a cycle, a number of elements starting from a position indicated by the second pointer of the barrel shifter are activated and after the activation, the second pointer is circularly shifted by the number to point to next inactive element in the barrel shifter.

18. The system of claim 17, wherein the number of elements indicates a magnitude of the negative thermometer data.

19. The system of claim 11, wherein when the first pointer and the second pointer are at a same element, the first pointer and the second pointer are moved to an element whose number is a random number.

20. The system of claim 11, wherein when the first pointer and the second pointer are at a same element number, both the first pointer and the second pointer are moved by a constant.

21. A method for converting digital signals into analog signals using a sigma-delta modulation, comprising:
providing a plurality of signed binary data to a signed thermometer encoder for converting the plurality of signed binary data into a plurality of signed thermometer codes, wherein positive binary data are converted into positive thermometer data and negative binary data are converted into negative thermometer data;
for a positive thermometer data (N):
activating N elements in a first barrel shifter starting from a first pointer; and
circularly shifting the first pointer by N elements; and
for a negative thermometer data (–N):
activating N elements in a second barrel shifter starting from a second pointer; and
circularly shifting the second pointer by N elements,
wherein each element of the first barrel shifter in relation to an initial first pointer position and each element of the second barrel shifter in relation to an initial second pointer position are paired up.

22. A method for converting digital signals into analog signals using a sigma-delta modulation, comprising:
providing a plurality of signed binary data to a signed thermometer encoder for converting the plurality of signed binary data into a plurality of signed thermometer codes, wherein positive binary data are converted into positive thermometer data and negative binary data are converted into negative thermometer data;
providing a first pointer and a second pointer to a barrel shifter;
for a positive thermometer data (N):
activating N elements in the barrel shifter starting from the first pointer;
activating a sign bit to indicate a positive thermometer code; and
circularly shifting the first pointer by N elements; and
for a negative thermometer data (–N):
activating N elements in the barrel shifter starting from the second pointer;
activating the sign bit to indicate a negative thermometer code; and
circularly shifting the second pointer by N elements.

23. A system for converting digital signals into analog signals using sigma-delta modulation, comprising:
a signed thermometer encoder for converting a plurality of signed binary data received at the encoder into a plurality of signed thermometer data, wherein positive binary data are converted into positive thermometer data and negative binary data are converted into negative thermometer data; and
a rotational dynamic element matching (DEM) component for receiving the plurality of signed binary data and the plurality of signed thermometer data, the rotational DEM arrangement further comprising:
means for storing activated elements as a function of signed thermometer data at a cycle,
means for pointing at a starting position of next signed thermometer data on the storing means; and
means for indicating a sign of the signed thermometer data.

* * * * *